United States Patent [19]

Shiota

[11] Patent Number: 5,077,833
[45] Date of Patent: Dec. 31, 1991

[54] SYNTHESIZER RECEIVER

[75] Inventor: Shinichi Shiota, Tokyo, Japan

[73] Assignee: Sony Corporation, Tokyo, Japan

[21] Appl. No.: 531,349

[22] Filed: May 31, 1990

[30] Foreign Application Priority Data

Jun. 8, 1989 [JP] Japan ................................. 1-145658

[51] Int. Cl.⁵ ........................................... H04B 1/16
[52] U.S. Cl. .................................... 455/173; 455/174
[58] Field of Search .............. 455/170, 174, 192, 194, 455/195, 183, 264, 260, 173

[56] References Cited

U.S. PATENT DOCUMENTS

| 3,467,868 | 9/1969 | Buhr | 455/174 |
| 4,027,242 | 5/1977 | Yamanaka | 455/183 |
| 4,244,055 | 1/1981 | Misawa et al. | 455/174 |
| 4,281,415 | 7/1981 | Rock, Jr. | 455/173 |
| 4,347,628 | 8/1982 | Speer | 455/173 |

FOREIGN PATENT DOCUMENTS

| 55-23648 | 2/1980 | Japan . |
| 1385896 | 3/1971 | United Kingdom . |
| 2004152 | 8/1978 | United Kingdom . |
| 2046043 | 3/1980 | United Kingdom . |

Primary Examiner—Curtis Kuntz
Attorney, Agent, or Firm—Lewis H. Eslinger; Jay H. Maioli

[57] ABSTRACT

A receiver having a frequency synthesizer tuner permits channel selection by rotating a dial, and the output muting time during channel selection is varied in response to the rotational speed at which the dial is turned, so that a listener/operator can gain an improved feel during channel selection that is similar to that present when operating a variable-capacitor tuner.

9 Claims, 5 Drawing Sheets

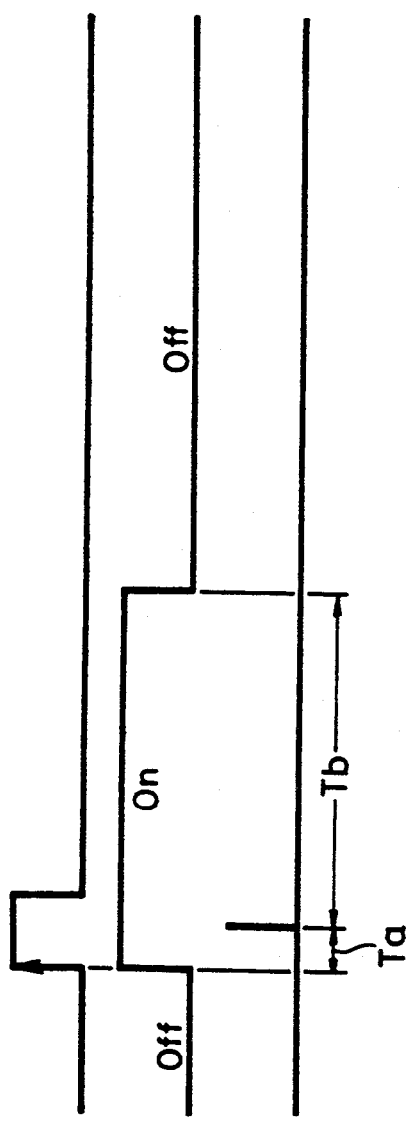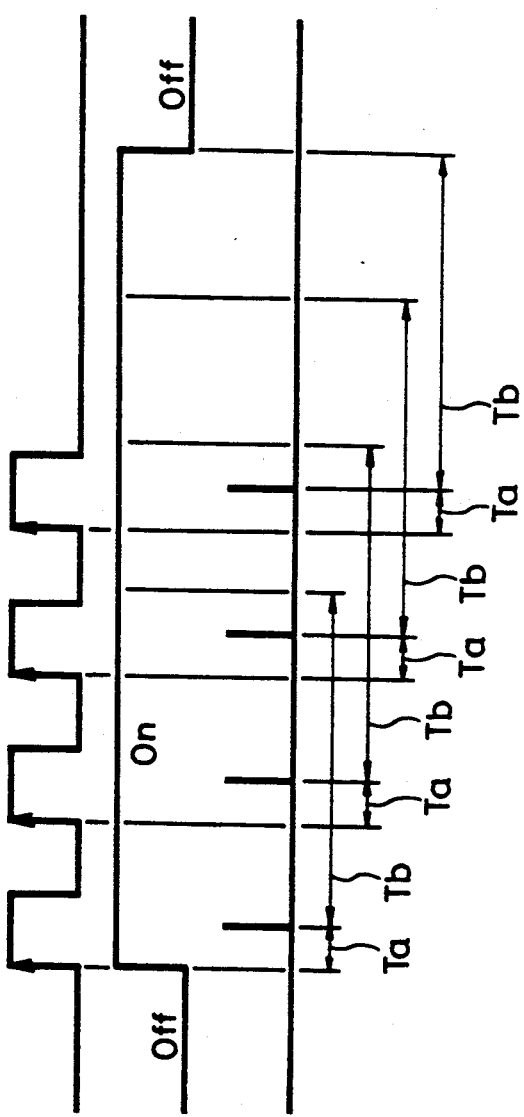

| N | 982 | 983 | ---------- | 1187 |
|---|---|---|---|---|
| fo | 98.2MHz | 98.3MHz | ---------- | 118.7MHz |
| fr | 87.5MHz | 87.6MHz | ---------- | 108 MHz |

SYNTHESIZER RECEIVER

BACKGROUND OF THE INVENTION

1. Field of the Invention

This invention relates generally to radio receivers and, more particularly, is directed to a radio receiver using frequency synthesizer tuning that can provide the operator with a fine tuning feel similar to that given by a variable-capacitor tuned radio receiver.

2. Description of the Background

In radio receivers employing a frequency synthesizer in the tuning circuitry, a local oscillation signal is formed by a voltage-controlled oscillator (VCO) in a phase-locked loop (PLL) configuration. When the frequency-dividing ratio N of the variable frequency-dividing circuit that is part of the phase-locked loop is varied, the local oscillation frequency varies in response and a change in the reception frequency occurs.

Accordingly, in the frequency synthesizer receiver channel selection can be performed by simple key operations that drive the tuned frequency up and down. For example, the reception frequency can be sequentially and continuously changed by simply depressing an up-channel key or a down-channel key. Nevertheless, although this kind of tuning is modern in technique when channel selection is accomplished by the aforenoted key operations it has been found to be troublesome and wearisome for the listener/operator.

On the other hand, in the more old-fashioned radio receiver utilizing a so-called variable capacitor to perform channel section, the listener finds it more enjoyable to tune the receiver by rotating a knob, while listening to sounds emanating from the loudspeaker of the receiver. It has been found that the listener feels better about tuning the reception frequency in the variable capacitor type receiver than when tuning the frequency synthesizer receiver.

A frequency synthesizer receiver has been proposed in which a dial, that is, a knob, is provided so that the frequency-dividing ratio N of the synthesizer is varied in response to rotation of the dial, thereby changing the reception frequency just like the variable-capacitor tuner.

It is also known that in a phase-locked loop (PLL), when the frequency-dividing ratio N is changed the loop requires a finite lock-up time to stabilize itself relative to the frequency-dividing ratio N thus changed. During this lock-up time, the reception frequency is not stabilized and, therefore, muting of the output sound must be effected.

In an example based on the broadcast standards of the United States of America, if the reception frequency is varied by one step, for example 100 kHz, by changing the frequency-dividing ratio N by 1 in an FM radio receiver, the lock-up time is as short as 2 milliseconds. Nevertheless, when the reception frequency is changed a large amount all at once, for example, from 87.5 MHz to 108 MHz, by changing the frequency-dividing ratio N from the minimum value to the maximum value, the lock-up time will increase to approximately 200 milliseconds.

Furthermore, even when the reception frequency is changed step by step, in increments of 100 kHz by changing the frequency-dividing ratio N by 1 each time, if the dial is continuously turned at a relatively high speed, then the frequency-dividing ratio N is considerably varied in a short period of time, so that the required lock-up time will be extended just like the case where the frequency-dividing ratio N is changed from its minimum value to its maximum value all at once. In other words, if the frequency-dividing ratio N is increased by a very large amount per unit time, the lock-up time of the phase-locked loop increases unacceptably.

Therefore, in a synthesizer receiver employing a dial, muting is effected during operation of the dial and the duration of the muting period is in a range of from 500 milliseconds to 1000 milliseconds.

More specifically, when the dial is rotated by one tuning increment amount corresponding to 100 kHz in an FM receiver, a device that detects the rotation of the dial will produce a pulse Pr, as shown in FIG. 1A. Then, at the leading edge of the pulse Pr the muting is turned ON from its OFF state, as shown in FIG. 1B. Further, when a preceding muting period Ta, for example, 10 milliseconds, elapses after the muting is turned ON, the frequency-dividing ratio N whose value is changed by 1 is set in the phase-locked loop.

When a succeeding muting period Tb, for example, 500 milliseconds, elapses after the new frequency-dividing ratio N is set in the phase locked loop, the muting is turned OFF.

On the other hand, when the dial is rotated more quickly, a number of pulses Pr proportional to the rotational amount of the dial will be generated with a pulse width and cycle corresponding to the rotational speed, as shown in FIG. 2A. Referring to FIG. 2B, the muting is turned ON at a timing point of the first pulse PR of the string of pulses and, as shown in FIG. 2C, a frequency-dividing ratio N whose value is changed by 1 at every leading edge of a pulse Pr is set in the phase-locked loop. Just as in the single increment example, when the period Tb elapses following the time Ta, in which the frequency dividing ratio is changed, the muting is turned OFF.

Accordingly, in this previously proposed system regardless of the rotational speed of the dial, the duration of the period Tb will be longer than that of the lock-up time of the phase-locked loop with respect to all pulses Pr, so that the muting is performed without fail during the lock-up time period of the phase-locked loop. Nevertheless, if the muting period Tb is determined as described above, when the fine tuning is performed by slowly rotating the dial in the forward or backward direction or when the reception frequency is varied by slowly rotating the dial, the duration of the muting period, that is, the period in which no sound is produced, will increase, so that the user finds it difficult and annoying to make fine tuning adjustments to the receiver.

OBJECTS AND SUMMARY OF THE INVENTION

Accordingly, it is an object of the present invention to provide an improved synthesizer tuned receiver that can eliminate the aforenoted shortcomings and disadvantages encountered with previously proposed receivers.

Another object of the present invention is to provide a synthesizer tuned receiver in which the muting time is reduced so as to provide a fine tuning feeling similar to that of a receiver utilizing variable-capacitor tuning.

A further object of the present invention is to provide a synthesizer tuned receiver in which muting can be positively performed during the lock-up time of a phase-locked loop used in the synthesizer tuner.

According to an aspect of the present invention, a synthesizer tuned receiver is provided in which a local oscillation signal is generated from a phase-locked loop and a frequency-dividing ratio of a variable frequency-dividing circuit in the phase-locked loop is varied, so that the frequency of the local oscillation signal is changed to vary the reception frequency. The receiver further comprises a dial, a rotary encoder connected so that rotation of the dial rotates the encoder, a circuit for varying the frequency-dividing ratio on the basis of an output from the rotary encoder, a muting circuit provided in the audio signal line, a circuit for controlling the muting circuit on the basis of the output from the rotary encoder, and a circuit responsive to the output of the rotary encoder for varying the length of time the circuit is operational on the basis of the speed of rotation of the dial.

The above and other objects, features, and advantages of the present will become apparent from the following detailed description of illustrative embodiments when read in conjunction with the accompanying drawings, in which like reference numerals represent the same or similar parts in the several views.

BRIEF DESCRIPTION OF THE DRAWINGS

FIGS. 1A, 1B, and 1C are waveform diagrams useful in explaining the operation of a previously proposed synthesizer tuned receiver;

FIGS. 2A, 2B, and 2C are waveform diagrams useful in explaining the operation of a previously proposed synthesizer tuned receiver when the tuning dial is turned quickly;

DETAILED DESCRIPTION OF PREFERRED EMBODIMENT

Figure 3:
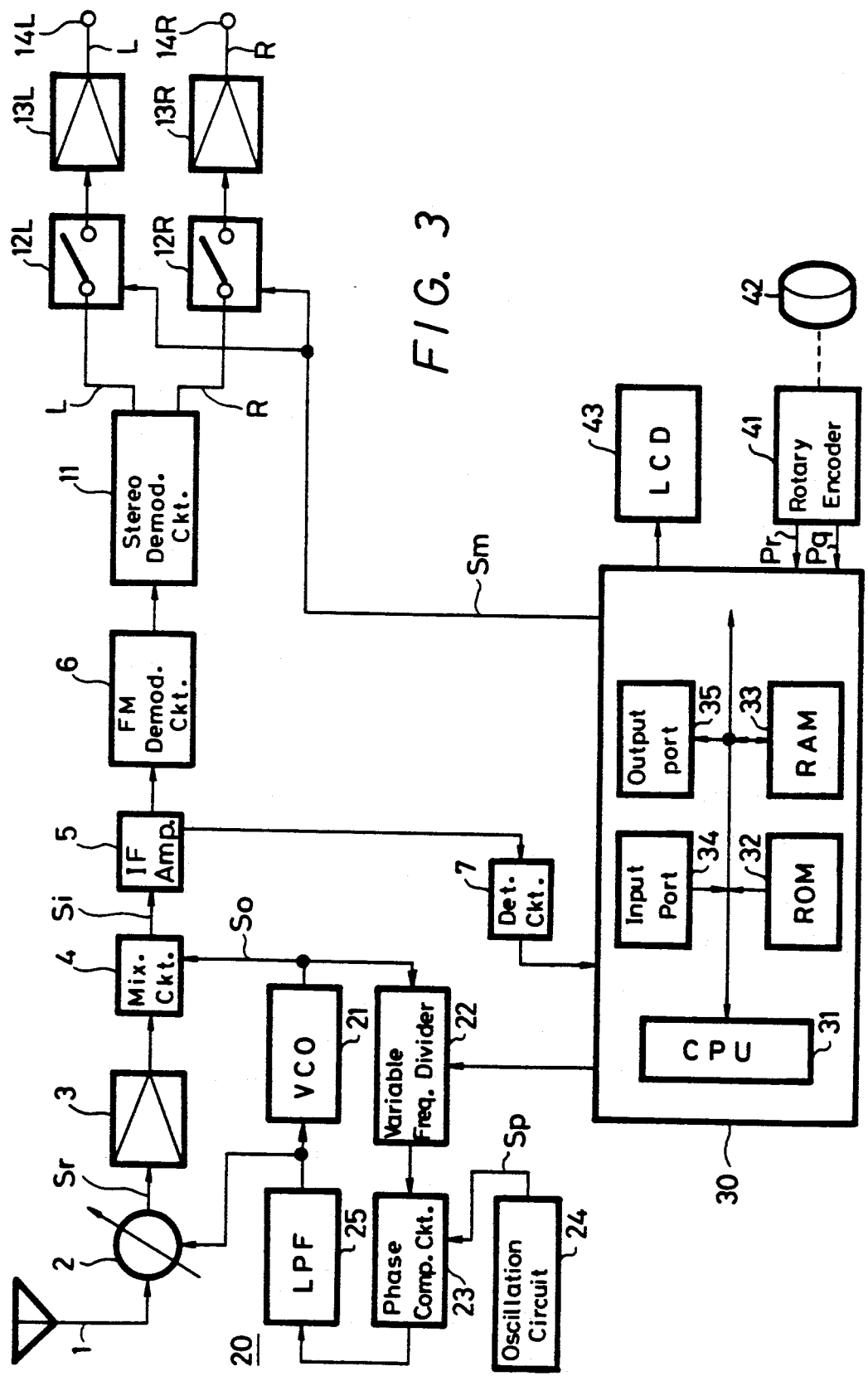
FIG. 3 is a schematic in block diagram form showing a synthesizer-type receiver according to an embodiment of the present invention.

FIG. 3 is a block diagram showing an embodiment of a synthesizer-type receiver according to the present invention, in which the circuit elements designated by reference numerals 1 to 14R constitute a receiving system.

More specifically, a broadcast signal is received at an antenna 1 and supplied to an antenna tuning circuit 2 of the electronic tuning type, from which there is derived an FM broadcast wave signal Sr having a frequency fr. This signal Sr is supplied through a high-frequency amplifier 3 to a mixing circuit 4, and a voltage controlled oscillator (VCO) 21 derives an oscillation signal So having a frequency fo expressed as:

$$fo = fr + 10.7 \ (MHz) \quad (1)$$

This oscillation signal So is supplied to mixer circuit 4 as a local oscillation signal, and the broadcast signal Sr is frequency converted to an intermediate frequency (IF) signal Si. In this case the intermediate frequency is 10.7 MHz.

The intermediate frequency signal Si is supplied through an intermediate frequency (IF) amplifier 5 to an FM demodulating circuit 6, in which it is demodulated to provide a stereo composite signal or a monaural signal. The stereo composite signal, for example, is supplied to a stereo demodulating circuit 11, wherein it is demodulated to provide left and right channel stereo audio signals, L and R. Signals L and R are than supplied through switching circuits 12L and 12R and amplifiers 13L and 13R to output terminals 14L and 14R, respectively. The switches 12L and 12R are used to mute the left and right stereo signals L and R.

In the receiver of FIG. 3, voltage controlled oscillator 21 and the circuits numbered 22 to 25 constitute a phase-locked loop indicated generally at 20. More specifically, the signal So from voltage controlled oscillator 21 is supplied to a variable frequency-divider 22, in which it is frequency divided by N. The frequency-divided signal from the variable-frequency divider 22 is supplied to a phase-comparing circuit 23 along with an oscillation signal Sp having a reference frequency of 100 kHz that is generated by an oscillation circuit 24. Oscillation signal Sp is compared with the frequency divided signal in comparing circuit 23, and the compared output is supplied through a low-pass filter (LPF) 25 to voltage controlled oscillator 21 as the control voltage. The output of low-pass filter 25 is also supplied to tuning circuit 2 as a channel selection voltage.

Accordingly, in the steady state, a frequency-divided signal from frequency-dividing circuit 22 and the oscillation signal Sp are equal to each other in frequency so that the frequency fo of the oscillation signal So is expressed as:

$$fo = 100 \ (kHz) \times N \quad (2)$$

At that time, equation (1) is established.

Figures 4, 6:
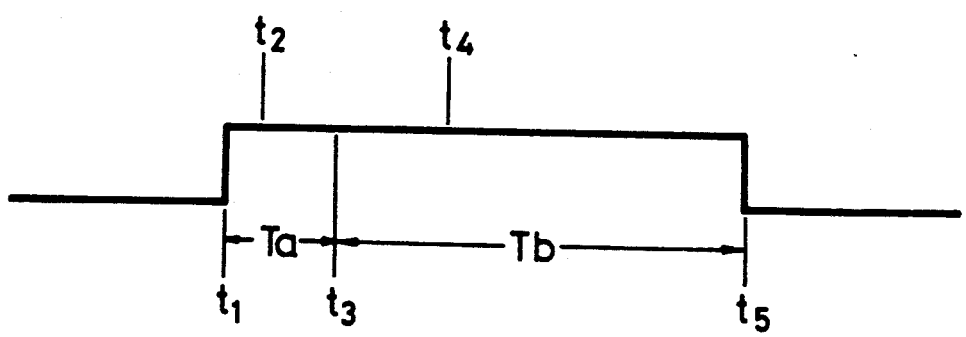
FIG. 4 is a table of a frequency dividing ratio, a local oscillation frequency, and a reception frequency useful in explaining the operation of the present invention.
FIG. 6 is a waveform diagram useful in explaining the operation of the present invention.

Therefore, if the frequency-dividing ratio N is changed by 1 increment each in a range of from 982 to 1187, as represented in the first line of the chart of FIG. 4, the local oscillation frequency fo is changed in steps of 0.1 MHz in the range from 98.2 MHz to 118.7 MHz, as represented by the second line in the chart of FIG. 4. Thus, as shown in the third line of the chart of FIG. 4, a reception frequency fr is changed in steps of 0.1 MHz in the range from 87.5 MHz to 108 MHz, in response to changes in the frequency-dividing ratio N.

In the circuit of FIG. 3, a microcomputer 30 is used to control the overall operation of this synthesizer tuned receiver embodying the present invention. In microcomputer 30 there are provided a central processing unit (CPU) 31, a read only memory (ROM) 32 in which there is written a routine 100 shown in detail in FIG. 5, a random access memory (RAM) 33 providing a processing work area, an input port 34, and an output port 35.

The frequency-dividing ratio N is supplied from microcomputer 30 and is set in frequency-dividing circuit 22, and a muting control signal Sm is supplied from system control circuit 30 to control switching circuits 12L and 12R. A rotary encoder 41 is electrically connected to microcomputer 30, whereby a pulse Pr and a pulse Pq are supplied to microcomputer 30 from rotary encoder 41. The phase of the pulse Pq is advanced or delayed relative to the phase of pulse Pr in response to the rotational direction of the input shaft of rotary encoder 41. A dial or knob 42 is attached to the input shaft of rotary encoder 41 for manual actuation.

A detecting circuit 7 is connected to intermediate frequency amplifier 5 to detect whether the intermediate frequency signal Si is present, and a detected output signal from detecting circuit 7 is fed to microcomputer 30. As a practical matter, a liquid crystal display (LCD) device 43 is connected to microcomputer 30 to display the received frequency fr in a digital fashion.

Figure 5A:
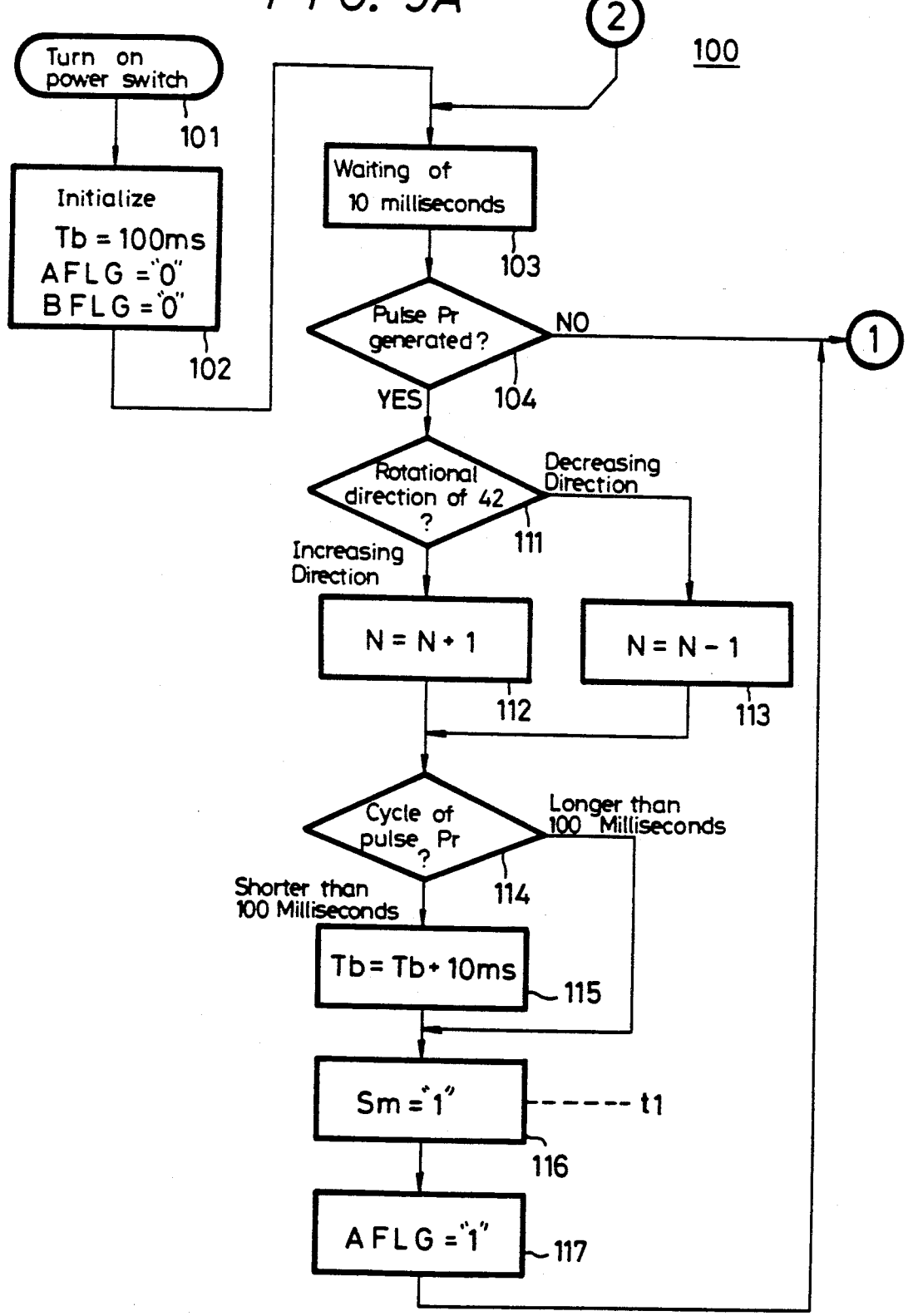
FIGS. 5A and 5B combine to form a flow chart useful in explaining the operation of the present invention.
Figure 5B:
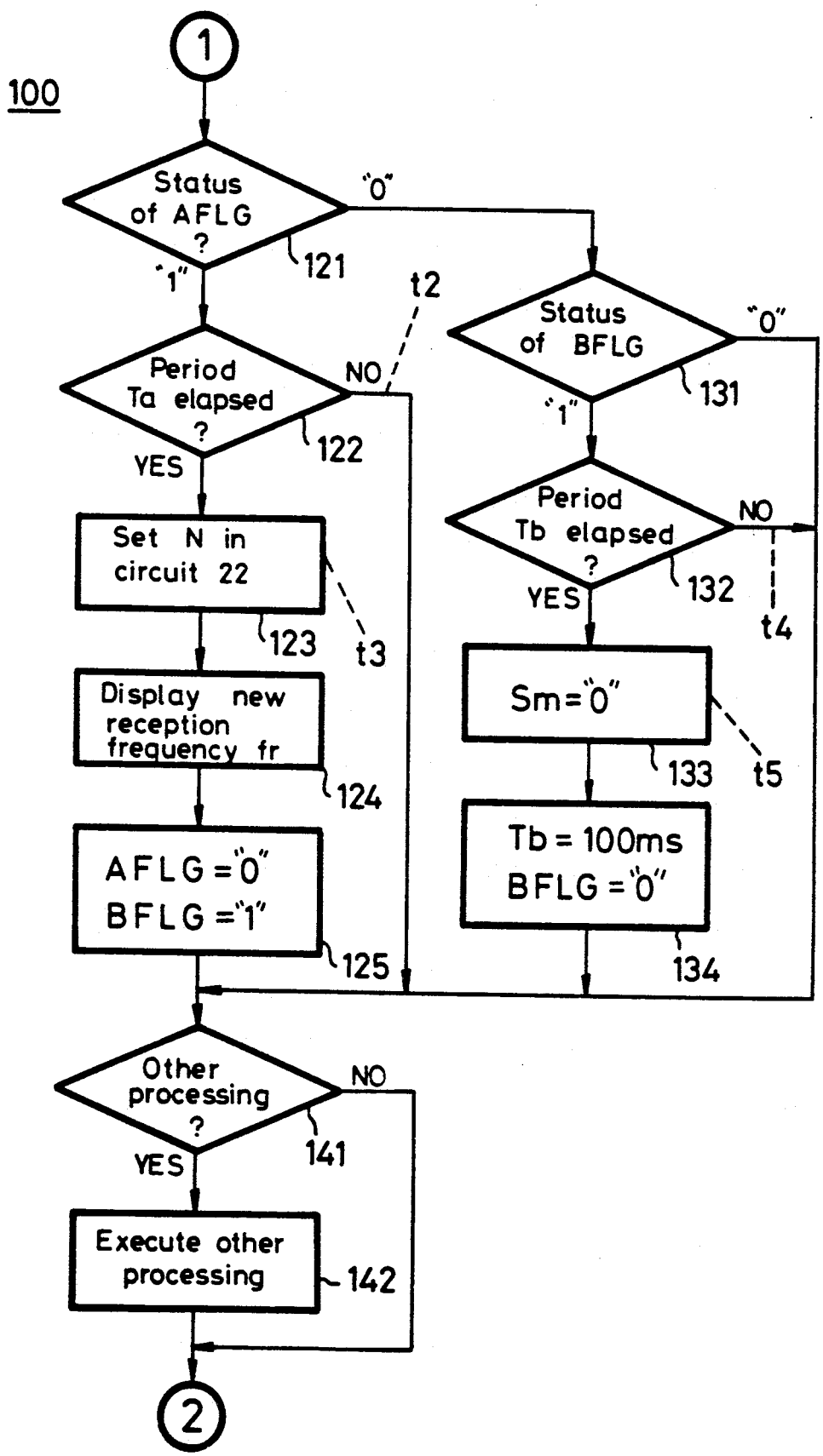

Microcomputer 30 operates under control of its central processing unit 31 that follows a predetermined routine 100, shown in the flowchart of FIGS. 5A and 5B. Referring to FIGS. 5A and 5B, when a power switch of the receiver is turned ON in step 101 processing of CPU 31 begins in step 102 with the initialization of flags and parameters. More specifically, period Tb is selected to be 100 milliseconds, and a preceding muting flag AFLG and a succeeding muting flag BFLG are both reset to "0".

The processing of the CPU 31 proceeds to step 103 where a waiting period of 10 milliseconds is carried out and, following that period, the processing of CPU 31 proceeds to decision step 104. It is determined in step 104 whether rotary encoder 41 is generating the pulse Pr, that is, whether dial 42 is being rotated. If the pulse Pr is not obtained at step 104, the processing of the CPU 31 proceeds from step 104. In decision step 121, the status of the flag AFLG is checked. In this case, since AFLG="0" was initially established, the processing of CPU 31 proceeds to decision step 131, where the status of the flag BFLG is checked. In this case, since BFLG="0" was initially established, then the processing of CPU 31 proceeds from step 131 to step 141, where it is determined whether any other processing was requested. If a NO is output at step 141, the processing of CPU 31 returns from to step 103. If a YES is output at step 141, then the processing of the CPU 31 proceeds from step 141 to step 142, where the requested processing is executed. Following that, the processing of CPU 31 returns to step 103.

Accordingly, when dial 42 is not turned, a loop of steps 103, 104, 121, 131, 141, and possibly 142, is repeated approximately every 10 milliseconds, in that order.

When dial 42 is turned by the operator, rotary encoder 41 produces the pulse Pr, which occurrence is identified at decision step 104. If a YES is output at step 104, then the processing of the CPU 31 proceeds to step 111, where the rotational direction of dial 42 is identified by checking the phase relation of pulses Pr and Pq. If it is determined that dial 42 is rotated in a direction to increase the received frequency fr, then the processing of CPU 31 proceeds to step 112. In step 112, the present frequency-dividing ratio N, stored in RAM 33 of microprocessor 30, is incremented by 1 unit, and the processing of CPU 31 proceeds to the next decision step 114.

On the other hand, if it is determined in step 111 that dial 42 is rotated in the direction to decrease the present received frequency fr, the processing of CPU 31 proceeds to step 113, where the frequency-dividing ratio N is decremented by 1 unit, and the processing of CPU 30 proceeds to decision step 114.

In decision step 114, the cycle of the pulse Pr is checked, that is, the rotational speed of the dial 42 is checked. If the cycle of the pulse Pr is shorter than 100 milliseconds, for example, the processing of CPU 31 proceeds from step 114 to step 115, where the muting period Tb is increased as Tb=Tb+10 milliseconds. In step 114 a maximum value for the period Tb is selected to be 500 milliseconds. After the muting period Tb has been increased, the processing of CPU 31 proceeds to step 116. On the other hand, if it is determined in step 114 that the cycle of the pulses Pr is longer than 100 milliseconds, the processing of CPU 31 proceeds directly to step 116.

At step 116, as shown at timing point $t_1$ in FIG. 6, the muting control signal Sm has a high level "1", whereby switching circuits 12L and 12R are opened and the muting operation is carried out. In the next step 117, AFLG="1" is set, and the processing of CPU 31 proceeds to decision step 121, wherein it is determined whether the first flag AFLG is "0" or "1". In this case, since AFLG="1" was established then the processing of CPU 31 proceeds to decision step 122, where it is determined whether the period Ta (Ta=10 milliseconds) has elapsed after the timing point $t_1$, at which time the processing at step 116 is secured.

In this case, the processing of CPU 31 is executed in the order of step 116, step 117, step 121, and step 122, while the period Ta has not yet elapsed, as shown at timing point $t_2$, so that the processing of CPU 31 proceeds from step 122 to decision step 141.

Thereafter, the processing of CPU 31 returns to step 103 and executes steps 103, 104, 111, 112, 114, 115, 116, 117, and 121 in that order. Then, when it is determined that period Ta has elapsed after timing point $t_5$, the processing of CPU 31 proceeds from step 122 to step 123, where the frequency-dividing ratio N stored in RAM 33 of microcomputer 30 is supplied to, and set in, frequency-dividing circuit 22 as a new frequency-dividing ratio N at timing point $t_3$. Accordingly, after the lock-up time from this timing point $t_3$, the received frequency fr is based upon the new frequency-dividing ratio N.

Then, the processing of CPU 31 proceeds to step 124, where the data indicative of the new reception frequency fr is supplied to liquid crystal display (LCD) device 43, and the new reception frequency fr is digitally displayed to the operator. In the next step 125, flags AFLG "0" and BFLG "1" are established, and the processing of CPU 31 proceeds to step 141.

Thereafter, the processing of the CPU 31 returns to step 103, and again proceeds through step 104 to step 121. In this case, since AFLG="0" is established, the processing of CPU 31 proceeds from step 121 to step 131. In step 131, the flag BFLG="1" is determined and the processing of CPU 31 proceeds to step 132, where it is determined whether the period Tb has elapsed starting from timing point $t_3$. In this case, decision step 132 is executed for the first time, and the period Tb has not yet elapsed, as shown at timing point $t_4$ in FIG. 6. Then, the processing of CPU 31 proceeds from step 132 to step 141.

As described above, a loop formed of step 103, step 104, step 121, step 131, step 132, step 141, and possibly step 142, is repeated from the timing point $t_3$. At that time, if dial 42 is further rotated, steps 111 to 117 are executed, whereby the muting time Tb is increased from 100 milliseconds in increments of 10 milliseconds each. Further, at that time, AFLG="1" is established at step 117, so that the operations such as steps 103 to 121 to step 125 or the like during the timing points $t_1$ to $t_5$ are executed.

At timing point $t_5$, the muting period Tb will have elapsed and this timing lapse is identified at step 132, at which time the processing of CPU 31 proceeds from step 132 to step 133, whereat Sm="0" is established, resulting in switching circuits 12L and 12R being released and closed so that the muting ceases. In the next step 134, the period Tb is selected to be 100 milliseconds and the succeeding flag BFLG is reset to "0". Then, the processing of CPU 31 proceeds to step 141.

If the frequency of the newly selected channel is such that the broadcast wave signal Sr can not be received, Sm="1" is established on the basis of the detection output from detecting circuit 7, and muting is carried out for the received frequency fr.

As described above, according to the present invention, in a synthesizer-tuned receiver performing channel selection by utilizing a dial as in a variable-capacitor tuner, the muting time Tb is varied in response to the rotational speed of the dial, so that when fine tuning is carried out by slowly turning the dial, the muting time can be reduced, which can provide the operator a fine tuning feel similar to that given by the variable-capacitor tuned radio receiver.

Further, when the dial is turned quickly, the muting time is increased, so that the lock-up time period for the phase-locked loop in the synthesizer tuner can be positively muted.

Having described a preferred embodiment of the invention with reference to the accompanying drawings, it is to be understood that the invention is limited to that precise embodiment and that various changes and modifications could be effected by one skilled in the art, without departing from the spirit or scope of the invention as defined in the appended claims.

What is claimed is:

1. A frequency synthesizer tuned receiver in which a local oscillation signal is generated by a phase-locked loop and a frequency-dividing ratio of a variable frequency divider in the phase locked loop is varied so that a frequency of the local oscillation signal is changed to vary a reception frequency of the receiver, comprising:

a tuning dial;

a rotary encoder arranged to rotate in response to rotation of said tuning dial for producing pulses the period of which indicates a rotational speed of said tuning dial;

means for varying the frequency-dividing ratio of the variable frequency divider in response to an output from said rotary encoder for changing the reception frequency of the receiver;

a muting circuit arranged in an audio output signal line of the receiver for selectively muting an output signal of the receiver; and means for controlling said muting circuit in response to an output from said rotary encoder and for varying a muting time of said muting circuit in response to a speed of rotation of said dial detected by said rotary encoder.

2. A frequency synthesizer tuned receiver according to claim 1, wherein said means for controlling said muting circuit and for varying the muting time of said muting circuit include means for reducing the muting time when the period of said pulses is longer than a predetermined time and said tuning dial is rotated slowly.

3. A frequency synthesizer tuned receiver according to claim 1, further comprising means for visually displaying the reception frequency of the receiver.

4. A frequency synthesizer tuned receiver according to claim 1, wherein said rotary encoder produces two output signals in response to rotation of said tuning dial, in which a leading/lagging phase relationship between said two output signals indicates a direction of rotation of said tuning dial.

5. A frequency synthesizer tuned receiver according to claim 1, further comprising a detector circuit responsive to the reception frequency of the receiver for detecting whether a broadcast signal is received at the reception frequency and producing an output signal fed to said means for controlling for causing the muting circuit to mute the output signal when the broadcast signal is not received at the reception frequency.

6. A receiver in which a phase-locked loop circuit includes a variable-frequency divider that varies the frequency of a local oscillation signal to vary a reception frequency of the receiver, comprising:

a rotary encoder having a knob and shaft arranged for manual rotation by an operator of the receiver for producing a train of pulses having a period that varies in response to a speed of the manual rotation of the knob;

means for varying a frequency-dividing ratio of the variable-frequency divider in response to an output of said rotary encoder;

muting means arranged in an audio output signal line of the receiver for selectively interrupting an audio output signal of the receiver; and means connected to said rotary encoder and said muting means for controlling a time period of operation of said muting means in response to the period of said train of pulses produced by said rotary encoder.

7. A receiver according to claim 6, wherein said means for controlling includes means for reducing the time period of operation of said muting means when the period of said train of pulses is longer than a predetermined time.

8. A receiver according to claim 6, wherein said rotary encoder produces two output signals each consisting of said train of pulses in response to rotation of said knob, in which a phase relationship between said two output signals indicates a direction of rotation of the knob.

9. A receiver according to claim 6, further comprising a detector circuit responsive to the reception frequency of the receiver for detecting whether a broadcast signal is received at the reception frequency and producing an output fed to said means for controlling for causing the muting circuit to mute the audio output signal of the receiver when no broadcast signal is detected at the reception frequency.

* * * * *